US007009625B2

(12) United States Patent
Dickinson

(10) Patent No.: US 7,009,625 B2

(45) Date of Patent: Mar. 7, 2006

(54) METHOD OF DISPLAYING AN IMAGE OF DEVICE TEST DATA

(75) Inventor: Paul J. Dickinson, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 106 days.

(21) Appl. No.: 10/386,861

(22) Filed: Mar. 11, 2003

(65) Prior Publication Data

US 2004/0179024 A1 Sep. 16, 2004

(51) Int. Cl.
*G09G 5/00* (2006.01)
*G06T 11/20* (2006.01)
*G01R 31/28* (2006.01)

(52) U.S. Cl. ........................ 345/629; 345/440; 714/729

(58) Field of Classification Search ................ 345/134, 345/629, 440; 714/27, 720–738; 382/112
See application file for complete search history.

(56) References Cited

U.S. PATENT DOCUMENTS 5,485,473 A * 1/1996 Diebold et al. ............. 714/724
5,682,249 A 10/1997 Harrington et al.
5,812,112 A * 9/1998 Helfferich .................. 345/629
6,275,600 B1 8/2001 Banker et al.
6,442,733 B1 8/2002 Fujiwara et al.
6,678,643 B1 * 1/2004 Turnquist et al. ........... 714/738
6,742,152 B1 * 5/2004 Terry .......................... 714/729
6,751,767 B1 * 6/2004 Toumiya ..................... 714/738
2001/0006558 A1 7/2001 Ohta
2002/0152436 A1 10/2002 O'Dea
2003/0221148 A1 11/2003 Ohta
2004/0083407 A1 4/2004 Song et al.

* cited by examiner

*Primary Examiner*—Sumati Lefkowitz
*Assistant Examiner*—Chante Harrison
(74) *Attorney, Agent, or Firm*—Meyertons Hood Kivlin Kowert & Goetzel, P.C.; B. Noël Kivlin; Stephen J. Curran

(57) ABSTRACT

A method of displaying an image of device test data includes receiving a first device test file and a second device test tile including a first plurality of bits and a second plurality of bits, respectively. The method may also include generating a first graphic image representative of the first device test file by depicting each of the first plurality of bits using a unique pixel of a display. The method may also include generating a second graphic image representative of the second device test file by depicting each of the second plurality of bits using a unique pixel of a display. Further, the method may include overlaying the second graphic image onto the first graphic image.

19 Claims, 7 Drawing Sheets

SCAN_IN SIXTHCHAIN :=
T'HHLLLLLLLHHLLLHHHLLHHHHHLHHLHHLHHLHHLHHLHHHHHLHHLHHHHHHHHLHHHHHLHHLHHHHHHH
HLHHLHHLHHLHHLHHLHHLHHHHHLHHHHHLHHHHHLHHHHHLHHHHHHHHHHHHHHLHHLHHHHHLHHLHHL
HHLHHLHHLLHHLHHHLLHHHLHLLHHLHHHHHHLHHLLLLLLLHLHHLHHLLHHHHHHHHHHLHHHHHHHHHHH
HHHLHHHHHLHHHHHHHHHHHHHHLHHHHHHHHLHHLHHHHHLHHLHHLHHHHHHHHHHHHHHLHHLHHHHHL
HHHHHLHHHHHLHHHHHLHHLHHLHHLHHLHHHHHLHHHHHHHHHHHHHHLHHHHHHHHHHHHHHLHHLHHLHH
HHHHHHLHHLHHHHHLHHHHHLHHHHHHHHLHHLHHLHHHHHLHHHHHLHHHHHLHHLHHHHHLHHHHHHHL
HHLHHHHHHHHHHHHHHLHHHHHLHHHHHHHHLHHHLHHLLLLHLHHHHHLHLHHLLHLHHHLLHLHLHHHLHH
LLLHLHHHHHHHHHHLHHHHHHLHHLHHLHHLHHHHHLHHHHHLHHHHHLHHLHHHHHHHHHHHHHHHHLHHH
HHLHHHHHLHHLHHLHHHHHLHHLHHLHHHHHLHHHHHHHHLHHLHHHHHHHHLHHHHHLHHLHHLHHLHHLHH
HHHHHLLHHHHHLHHHHHHHHHHHHHHHLHLHHHHHHHHLHHLLHHHHHHHHHHLHHLLLHHLLHHHHHHHH
LHHHHHHHHHHHLHHLLHHHHHLHHLHHHHHHLHLHHLHHLHHHHHHLHHHHHHHHHHHHHHLLHHHHHHHH
HHLHHHHHLHHHHHLHHLHHLHHLLHLHHLLHHLHHLLHLLLLHLHHHHHLLLHLHLHLHHHHHHHLHHLLHLHLHH
LHLHHHLLHLLHHLLLLHLHHH

SCAN_OUT SIXTHCHAIN:=
T'111111101111001011000000111111111111101111111111111011111111111111110111110110110111111
0111111110110111110111111111111110111111111111111101101111101111101110110111000111111011110
100110100000001110010M1011101111101101100111111111101111111111111101101111101111111111111
1011011001011011111011011011011111011011011011111111011111111011111011111000000000110110000
1100000010001110001101101110001101111101110001110000011100010000001100001101101111110010010
010010010010001110001110111001111111111001100110110110010010010001100M0101110010011100000011
0111110111110000110110110110111001000111000111000110111001000110110111111101110010011100000
0011100010000010001100OM00M00M00M110MMM00M000MMM11M00M11M110MMM00M11M00M110MMM11
M11M00M110MMM111M11M11M00MMMM001M00M11M11MMMM001M11M11M00MMMM00M11M00M11MMM
M00M11M00M111MM00M11M00M11M11M00M00M11M11M1111111111101000100001101010000010101 10M0
11111111010001011101000111010001010101111M

FIG. 2

METHOD OF DISPLAYING AN IMAGE OF DEVICE TEST DATA

BACKGROUND OF THE INVENTION

1. Field of the Invention

This invention relates to circuit testing and, more particularly, to the displaying of test patterns.

2. Description of the Related Art

Circuits are typically tested using an assortment of tests. Tests may be performed on a device by applying external stimuli to a device's inputs under a given set of conditions on a circuit tester and comparing the actual results to a given set of expected results. For example, in FIG. 1, a perspective view diagram of one embodiment of a device tester 10 is shown. Device tester 10 includes a CPU cabinet 100A which is coupled to a device tester component interface 100B via an interface cable 152. Further, device tester 10 includes a user interface 150 coupled to CPU cabinet 100A via an interface cable 151. A device-under-test (DUT) 110 is coupled to device tester component interface 100B using one of a variety of methods and hardware (not shown). The stimuli and the expected results are typically applied to DUT 110 using a test file which is commonly referred to as a test pattern.

Generally, a device test program and the test pattern are loaded into the tester memory (not shown). The test program may include software instructions written in any of a variety of programming languages, including some tester specific languages. The test program is executed by the tester CPU (not shown) and in conjunction with the test pattern a test environment may be created for the DUT. A user may control and monitor the testing process through user interface 150. Further, the user may view and edit the test patterns as well as analyze the test results through user interface 150. In addition, test program and test pattern files may be viewed and edited on a variety of other types of computer systems such as a network workstation or a desktop personal computer, for example.

One type of testing method that is commonly used to test integrated circuits is functional testing. During functional testing, DUT 110 is allowed to operate in one or more of its operating (i.e. functional) modes while the outputs are monitored and compared against a given set of expected results. Depending on the level of complexity of the circuit, functional testing may be an adequate testing method by itself.

However, due to such factors as increased device complexity, gate counts and test pin count constraints it has become more difficult to test a device adequately using only functional testing. In addition, creating large numbers of functional test patterns and then grading those patterns on commercial pattern grading tools can be an exhaustive task that may take many hours of computer time. Further, on many complex circuits, functional test patterns may routinely provide test coverage in the mid 80 percent range, while for many applications test coverage in the mid 90 percent range may be minimally acceptable. Thus another type of testing has become widely used: scan-based testing. Using rigorous design-for-testability techniques and automated test pattern generation (ATPG) tools, scan-based testing has been shown to routinely produce test patterns having test coverage in the upper 90 percent range.

Scan testing typically involves using one or more scan chains. A scan chain is created using scannable elements such as flip-flops that are part of the circuit, although other clocked storage devices may be used. The output of a given flip-flop is coupled to the input of another flip-flop. A large number of flip-flops may be connected in this manner, forming a scan chain that passes through the internal logic of the circuit. The scan chain may be thought of as a serial shift register, in which values are shifted from one register flop to the next. Using this method, multiple scan chains may be formed in a given integrated circuit.

To test a circuit using one type of scan chain, a scan test pattern, which is sometimes referred to as scan data or a test vector, is shifted or clocked into the scan chain using a scan clock in a scan mode, thereby loading each element of the scan chain with a predetermined value. For example, a scan chain containing 50 scan elements will be loaded with 50 predetermined values using 50 scan clock cycles. Following the initial loading, the circuit is then reverted to its normal operating mode. The circuit may then be clocked once with the system clock, allowing the predetermined values to propagate through the individual logic circuits connected to the scan elements. After allowing the circuits a sufficient time to respond, the scan data that is now contained in the scan elements is shifted out of the scan chain using the scan clock in the scan mode. The scan out data is compared with expected results to determine whether the circuit is faulty.

In a typical scan input pattern, logic ones and zeros are clocked into the scan chain. The scan output pattern contains the expected results. The results typically include a logic one, a logic zero or in some cases a "don't care" condition. These logic values are typically represented as different pattern symbols such as ASCII characters. Depending upon the type of tester used, the pattern symbols in the scan input and scan output patterns may be ones and zeros, or the letters 'H', 'L' and 'X' which represent a logic one, a logic zero and a don't care, respectively.

Referring to FIG. 2, an example of a scan pattern is shown. The scan pattern includes a scan input pattern and a scan output pattern. The top portion of the pattern is a scan input pattern and contains 912 scan input values. The bottom portion is a scan output pattern and contains 912 scan output values. The scan input pattern is depicted using 'H' and 'L' ASCII characters which represent logic values 1 and 0, respectively. The scan output pattern is shown using 1's and 0's which represent logic values 1 and 0, respectively. In addition, the ASCII character 'M' is used to represent a "don't care" value. In many cases, the ATPG tool may not be capable of generating an expected value of 1 or zero for a given scan input value. Thus, the ATPG tool may place a "don't care" in the respective location in the scan output pattern.

Many scan chains contain as many as 100,000 flip-flops, and accordingly each scan pattern may have 100,000 corresponding ones and zeros, and 100,000 H, L, and X symbols. Typically, after an ATPG tool generates a test pattern it must be verified for accuracy. In addition, after a device has been tested, failing units may be analyzed to determine the cause of the failure. In either case, a human must view the scan pattern or the results of a device test. The scan patterns may not only be difficult to look at, but it may be difficult to discern information in the context of a complete scan chain.

SUMMARY OF THE INVENTION

Various embodiments of a method of displaying an image of device test data are disclosed. In one embodiment, a method of displaying device test data may include receiving a first device test file and a second device test tile which may include a first plurality of bits and a second plurality of bits, respectively. The method may also include generating a first graphic image representative of the first device test file by depicting each of the first plurality of bits using a unique pixel of a display. The method may also include generating a second graphic image representative of the second device test file by depicting each of the second plurality of bits using a unique pixel of a display. Further, the method may include overlaying the second graphic image onto the first graphic image.

In another embodiment, a method of displaying an image of device test data may include receiving a first graphic image representative of a first device test file and a second graphic image representative of a second device test file. The first device test file may include a first plurality of bits and may depict each of the first plurality of bits using a unique pixel of a display. The second device test file may include a second plurality of bits and may depict each of the second plurality of bits using a unique pixel of a display. The method may further include generating a third graphic image by overlaying the second graphic image onto the first graphic image.

BRIEF DESCRIPTION OF THE DRAWINGS

FIG. 2 is a diagram illustrating an example of a scan input and a scan output pattern.

Figure 1:
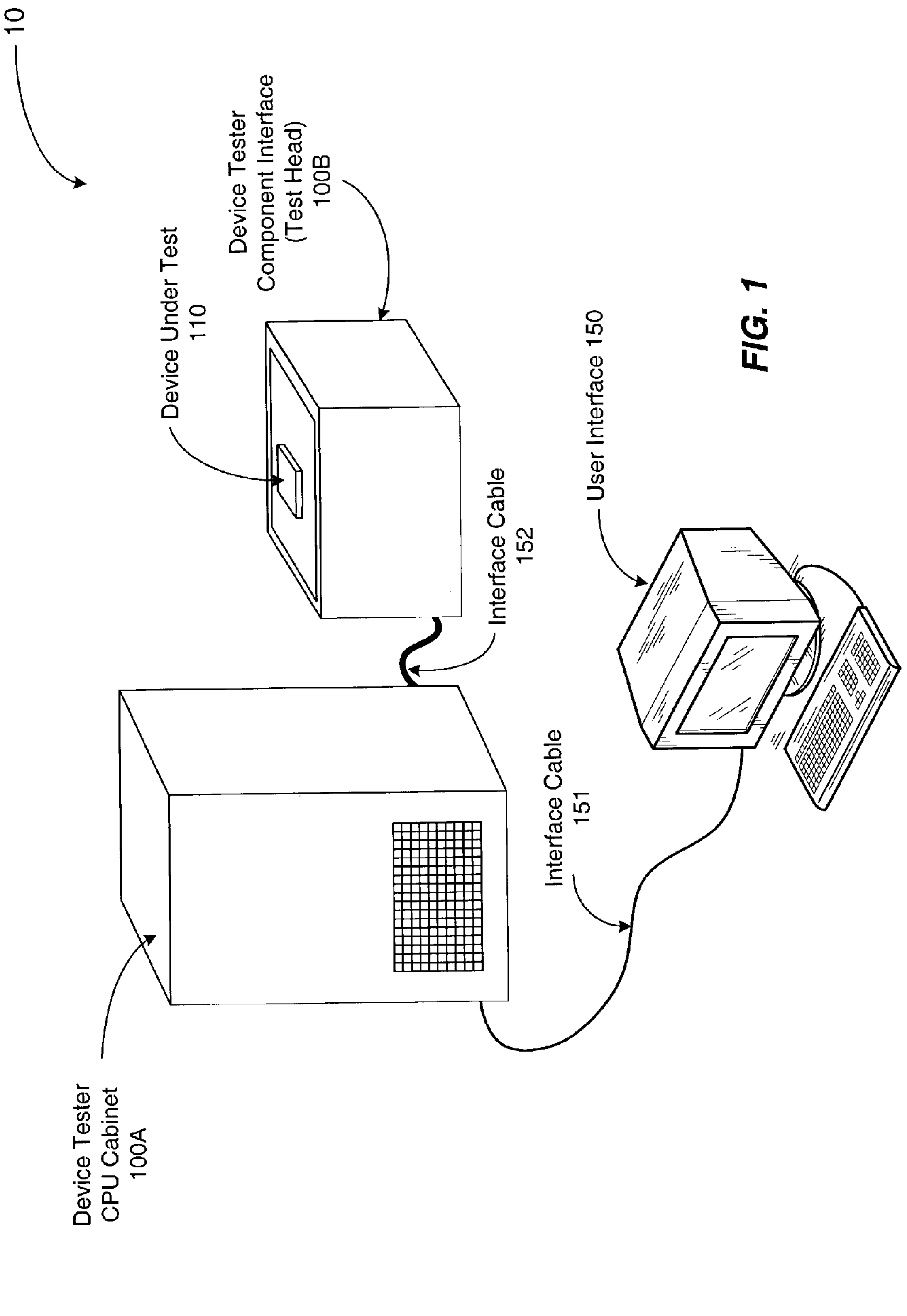
FIG. 1 is a perspective view diagram of one embodiment of a device tester.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 3:
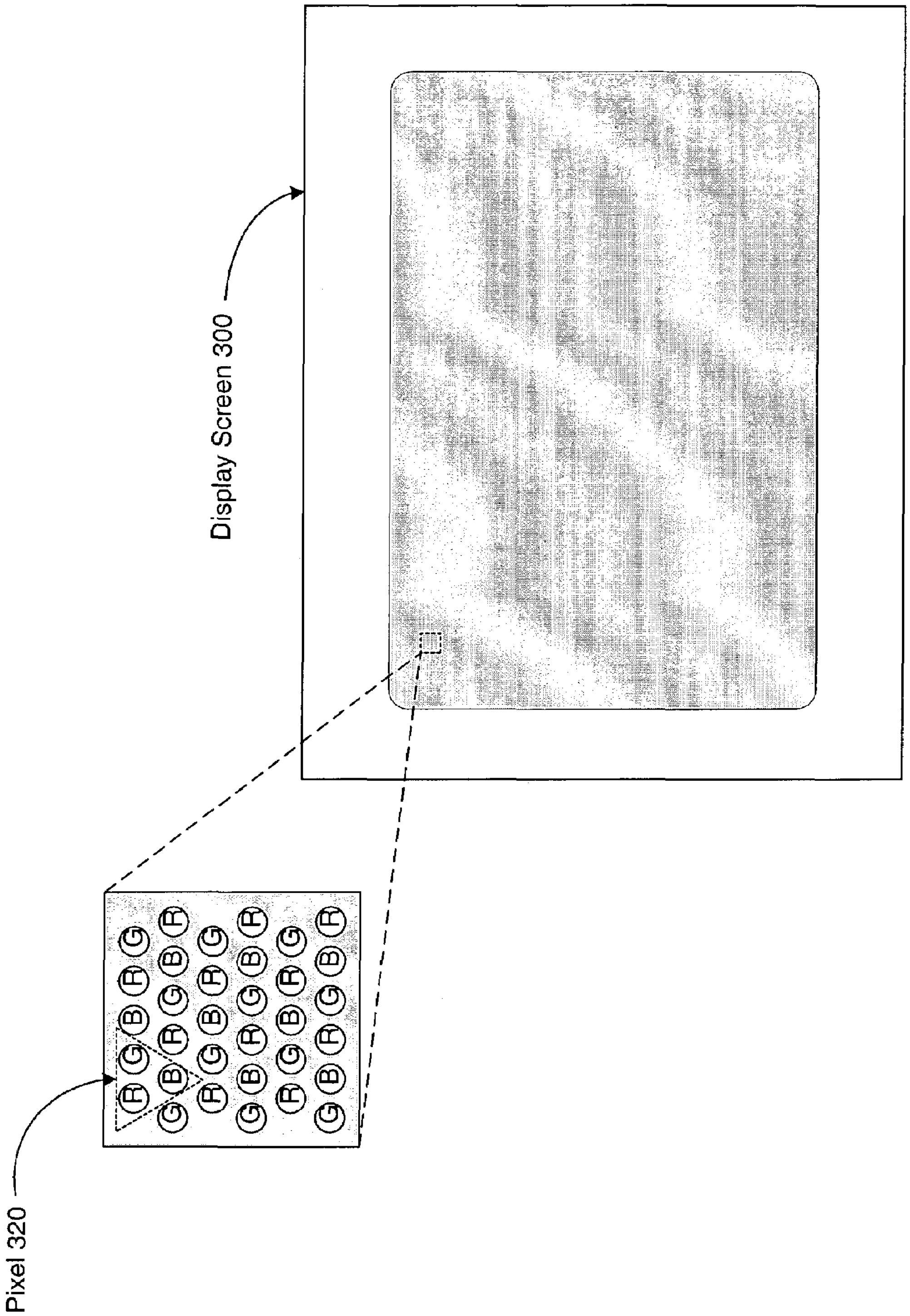
FIG. 3 is a diagram of a display screen illustrating of one embodiment a pixel orientation.

Turning now to FIG. 3, a diagram of a display screen illustrating one embodiment of a pixel orientation is shown. Display screen 300 is an example of the front viewing area of a display such as a cathode ray tube (CRT) display or a liquid crystal display (LCD). In the illustrated embodiment, display screen 300 is composed of many picture elements or "pixels." In most displays, a pixel is the smallest portion of the display screen that may be individually controlled. In the exploded view, a pixel 320 is shown as a dot trio including a red, green and blue dot which are enclosed by the dashed triangle. However, it is noted that although the illustrated pixel dots are circular and the trio is arranged in the shape of a triangle, in other embodiments, a pixel may be formed by dots having other shapes and the dot trio may be arranged differently.

To display an image on display screen 300, the pixels may be illuminated and depending on the type of display, each pixel may be illuminated differently. For example, in a CRT, the individual dots may be phosphor dots which are selectively struck by electrons causing them to glow. On the other hand, an LCD pixel may be illuminated by backlighting the LCD panel using a fluorescent light element and filtering the light using polarizing active filters (e.g. liquid crystals). Each pixel may be illuminated to a different color and intensity.

In either type of display, the pixel count may range from as many as 1.9 million pixels to 480 thousand pixels depending on the resolution and size of a particular display. For example, some displays have a resolution of 1600×1200 pixels, while others may have as few as 800×600 pixels or fewer.

Thus, as will be described in greater detail below, representing a piece of data using a unique pixel may allow large amounts of certain types of data to be displayed on display screen 300 at a given time.

To create an image on display screen 300, a graphics adapter is typically used. Generally speaking, a graphics adapter may include a graphics processor and a random access memory digital-to-analog converter (RAMDAC). In addition, the graphics adapter may include some type of memory. The graphics adapter may process digital image data created either by a system processor or by the graphics processor and convert the digital image data into analog signals which may be displayed. For a CRT, the RAMDAC may provide the red, green and blue signals to the display, while for an LCD or other digital display, the digital signals may be sent to the display directly.

As described above, many graphics images are generated by a graphics adapter. Since many images are complex to generate, software packages including software drivers generally control how the images are created by the graphics adapter. Some software packages may read an image file which has been generated and saved and that defines the image. There are many commercially available file formats such as the joint photographic experts group (JPEG), graphics interchange format (GIF), tagged image file format (TIFF), for example which may be used to create, save and display a graphics image. An image saved in one of these or other graphics file formats may be read and displayed.

Figure 4:
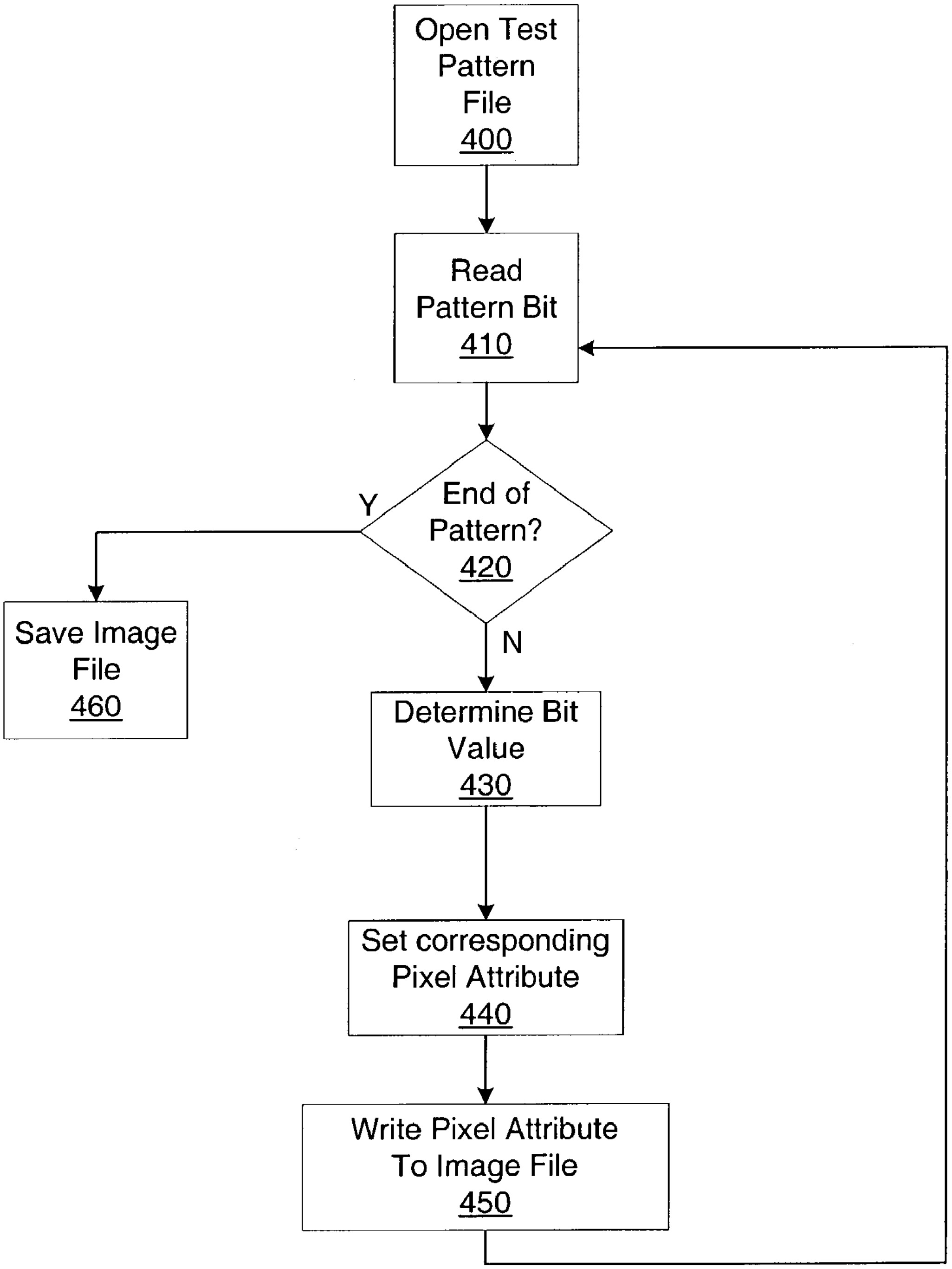
FIG. 4 is a flow diagram describing one embodiment of a method of displaying test pattern data.

FIG. 4 illustrates a flow diagram of one embodiment of a method of creating an image file representative of test pattern data for a display screen. As described above, an image may be created and saved in one or more graphics file formats and then subsequently displayed when that image file is read by graphics software. Beginning in block 400 a test pattern file may be opened by program code such as a script file written in any of a number of languages such as Perl, C or Unix, for example. Each bit in the test pattern file may be read (block 410). As each bit is read, the bit is checked to see if an end of pattern file marker has been read (block 420). If an end of file marker is encountered, then the test pattern file may be closed and an image file may be saved in one or more image file formats (block 460).

However, if an end of file marker is not encountered (block 420), the program code may determine what bit value it has read (block 430). The program code may compare each bit with a given set of bit values and subsequently determine a corresponding pixel attribute (block 440). As described above, a pixel attribute may be the color or the intensity of the pixel, for example. The program code may write the pixel attribute associated with the bit to the image file (block 450). For example, a script file may read in each bit as follows:

cat $1|awk '{if ($1="M") print "250 0 0"; else print "0 0 250";}'.

This piece of program code may check for don't care bits labeled 'M'. If it finds an 'M' it causes a red pixel to be output. In a typical red green blue arrangement, [250 0 0] may correspond to a red pixel, [0 250 0] may correspond to a green pixel, [0 0 250] may correspond to a blue pixel. It is noted that the code segment shown above is only an example and that other code segments are contemplated and may be used.

The sequence described by blocks 410 through 450 may be repeated until an end of file marker is encountered and the image file may be saved as described in block 460.

Once the image file has been created, it may be displayed on a display screen such as display screen 300 of FIG. 3. As will be described further below, the resultant image may depict each of the bits in the device test pattern using a unique pixel on the display. These images may be used for various test pattern and test data analysis functions. For example, a test data image may be used to determine where a don't care value may be located in a particular test pattern. The image may also provide a visual indication of other test pattern issues such as whether scan input values have been captured or not. Further, the image may be used to highlight bits which are predominantly ones or zeros. In addition, bits may be sorted by data value instead of bit position in the pattern to give a visual indication of which bits have which state. These are only a few examples of the possible uses of image files generated as described above. Other uses of the images are possible and contemplated.

Figure 5:
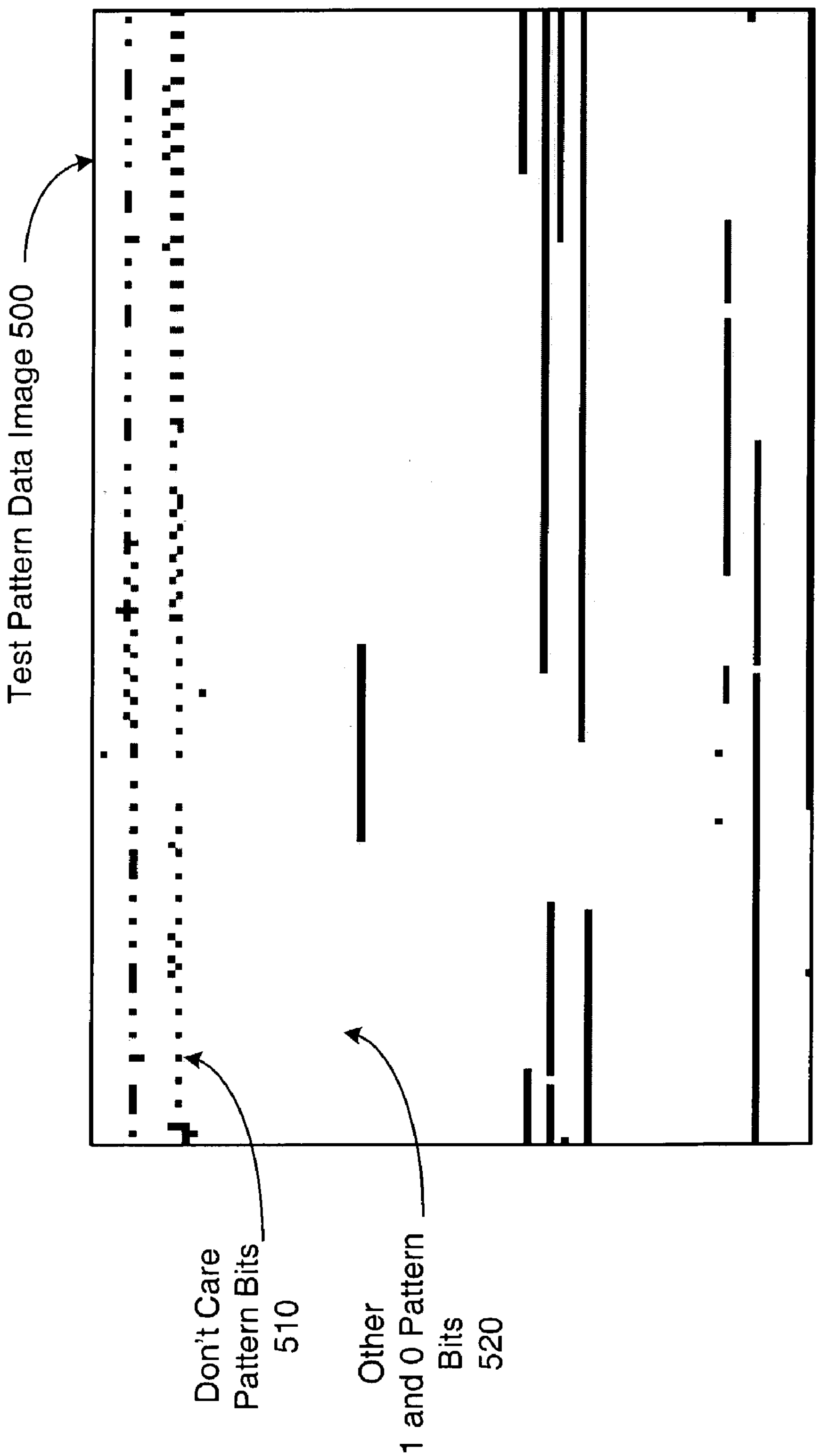
FIG. 5 is a diagram of one embodiment of an image corresponding to test pattern data.

Turning to FIG. 5, one embodiment of an image corresponding to test pattern data is shown. A test pattern data image 500 is an image which depicts a test pattern data file. Each test pattern data bit within a test pattern such as the scan test pattern illustrated in FIG. 2, for example, is depicted as a unique pixel.

In the illustrated embodiment, test pattern data image 500 includes black and white pixels. The pattern bits which are "don't care" bits are depicted as black pixels and designated Don't Care Pattern Bits 510. All other pattern bits are depicted as white pixels and designated Other 1 and 0 Pattern Bits 520. It is noted however that in other embodiments, any color may be used to depict any bit in a test pattern.

Test pattern data image 500 may be viewed on a display such as display screen 300 of FIG. 3. Thus, a test pattern containing hundreds of thousands of bits may be displayed in one image which may be viewed in a single screen without having to scroll through the image. In addition, the image file may be printed and viewed at some other subsequent time.

Figure 6:
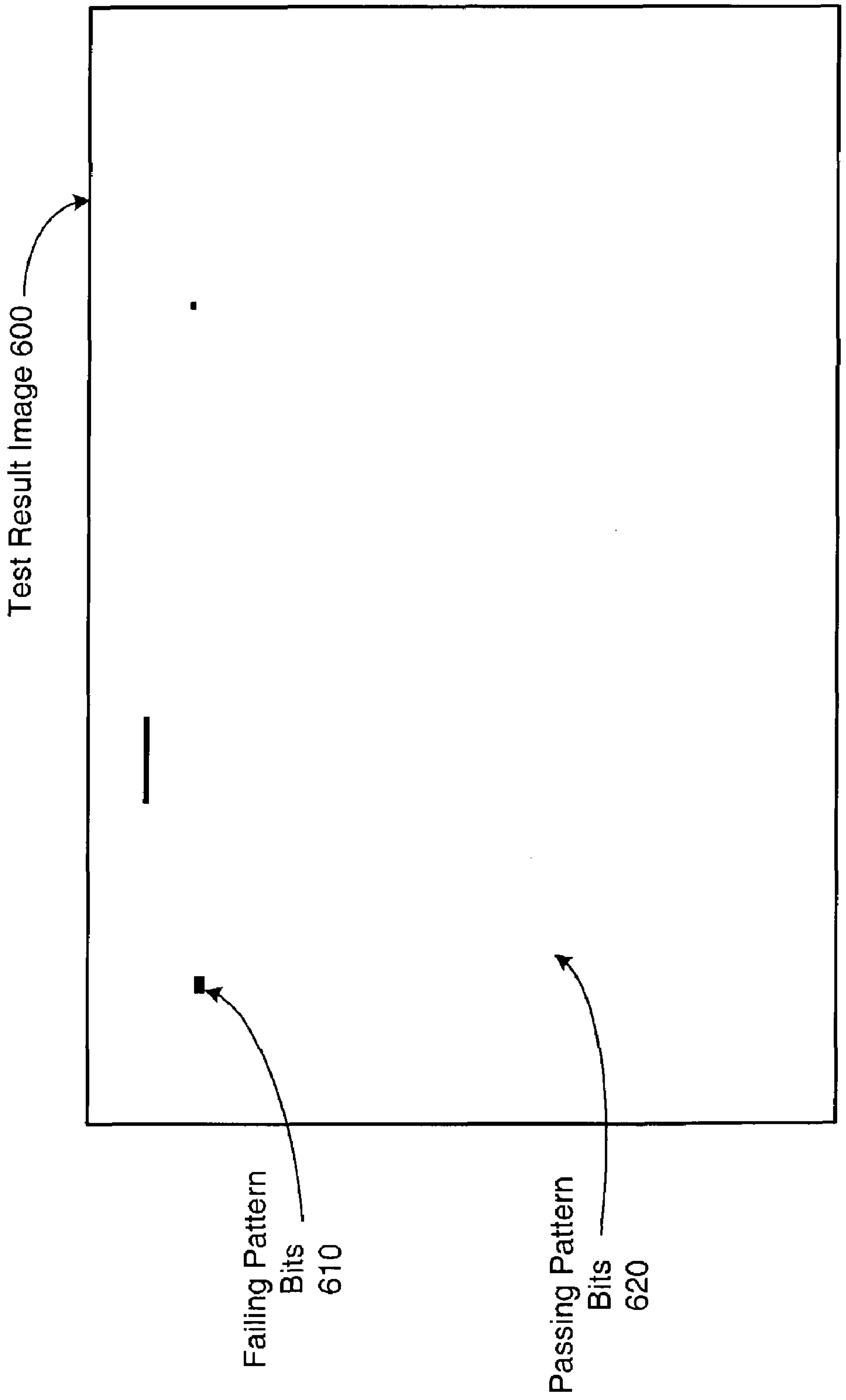
FIG. 6 is a diagram of one embodiment of an image corresponding to test result data.

Referring to FIG. 6, one embodiment of an image corresponding to test result data is shown. Test result image data 600 is an image which depicts a test result data file such as a data log file. Each result data bit is depicted as a unique pixel. Test result image data 600 includes black and white pixels. The data log bits corresponding to passing pattern values are depicted using white pixels and designated Passing Pattern Bits 620. The data log bits corresponding to failing pattern values are depicted using black pixels and designated Failing Pattern Bits 610. It is noted that in other embodiments, other colors may be used for a given pixel. For example, data log bits corresponding to passing pattern values may be depicted using a pixel color such as green, while data log bits corresponding to failing pattern values may be depicted using a pixel color such as red.

Thus, by depicting each bit in a data log as a unique pixel on a display, a user may view hundreds of thousands of bits at a glance. This type of display may enhance failure analysis of a failing device.

For example, in one embodiment, each pixel may represent not only the type of data in the test pattern, but the pixel location may also be representative of the position of the data bit within a test sequence or scan chain. This in turn may give position or location information relative to the flip-flop or other storage element within the device. Thus the positions of particular values of the pattern data may create a signature when viewed as a graphic image.

In addition, an image may be created using different pattern images that are overlaid onto a test result image thereby possibly allowing users to quickly identify specific types of failure modes and or false failure modes. For example, test result data images having particular signatures may be created for many device failure modes and labeled accordingly. When a production test facility encounters failing devices, users may generate an overlay image by overlaying a particular test result data image from a failing device onto a test result data image having a known signature. When viewing the overlay image they may be able to quickly identify whether the testing equipment or environment is at fault or whether additional support or analysis may be necessary. Similarly, images of test pattern files may be overlaid for test pattern analysis. Further, test pattern images may be created and overlaid onto one another for identification of certain types of test pattern issues.

As used herein, overlaying an image refers to placing one image on top of another image such that the attributes of each pixel of one image are compared to the attributes of each pixel in a corresponding location in a second image. Thus, when generating an overlay image, each resultant pixel in the overlay image is assigned attributes based upon the comparison. As will be described further below, in one embodiment, pixels which occupy corresponding locations in the first and second images but which have different attributes may be assigned pixel attributes that are different from the attributes assigned to the pixels in either the first or the second images. Further, pixels which occupy corresponding locations in the first and second images and have the same attributes may be assigned pixel attributes that are the same as the attributes assigned to the pixels in both the first and the second images.

Figure 7:
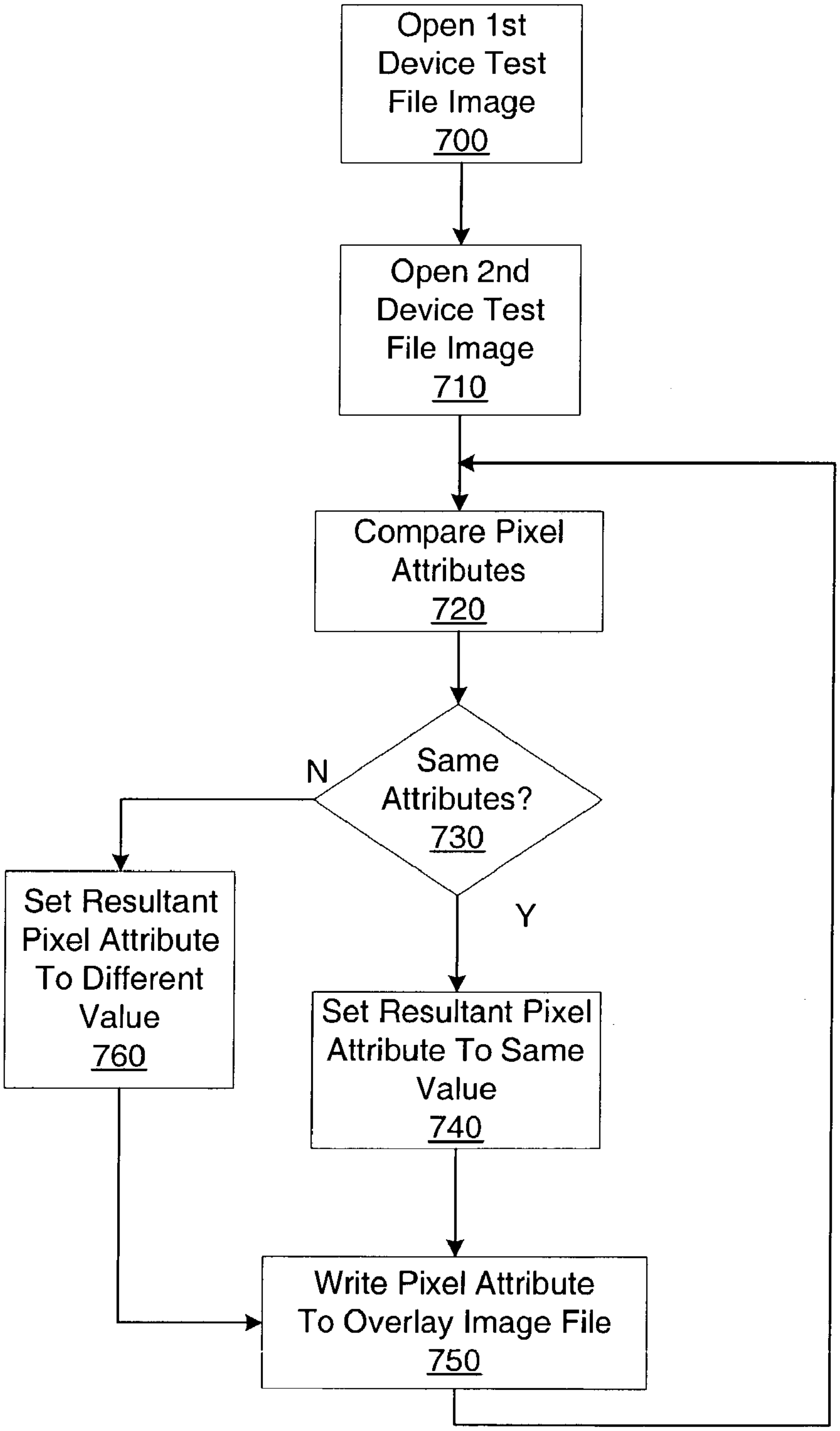
FIG. 7 is a flow diagram describing one embodiment of another method of displaying device test data.

Turning to FIG. 7, a flow diagram describing one embodiment of another method of displaying device test data is shown. A test image file may be created and saved in one or more graphics file formats and then subsequently displayed when that image file is read by graphics software. Beginning in block 700 a test data file image may be opened by program code such as a script file or other program instructions written in any of a number of languages such as Perl, C or Unix, for example. A second test data file image may be opened (block 710). It is noted that the first and the second test data image file may be image files as described above in conjunction with the description of FIG. 4 through FIG. 6. For example, the image files may each represent a device test pattern or other device test data file including a plurality of bits. Each image file may include pixels which uniquely depict each of the bits within a test data file. As each image file is read, the pixel attribute information in the first image file is compared to the pixel attribute information in the second each image file on a pixel-by-pixel basis (block 720).

If the pixel attribute information is the same (block 730), the pixel attribute information (e.g. resultant pixel data) is set to the values in both the first and second test image files (block 740). A new image file or overlay image file is created and the resultant pixel data is written to the overlay image file (block 750).

Referring back to block 730, if the pixel attribute information is not the same (block 730), the resultant pixel data attributes are set to a new resultant value (block 760), which may include a different pixel color than the pixel color used in either the first or the second image files. The resultant pixel attribute is written to the overlay image file (block 750). The above steps may be repeated until all the pixels in the two image files have been compared.

It is noted that the above embodiments describe methods which may be implemented using program instructions. It is contemplated that various other embodiments may further include receiving, sending or storing instructions and/or data implemented in accordance with the above descriptions upon a carrier medium. Generally speaking, a carrier medium may include storage media or memory media such as magnetic or optical media, e.g., disk or CD-ROM, volatile or non-volatile media such as RAM (e.g. SDRAM, DDR SDRAM, RDRAM, SRAM, etc.), ROM, etc. as well as transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of displaying test data for a device, said method comprising:

receiving a first device test file comprising a first scan test pattern, wherein said first device test file includes a first plurality of bits;

receiving a second device test file comprising a second scan test pattern, wherein said second device test file includes a second plurality of bits;

generating a first graphic image representative of said first device test file by depicting each of said first plurality of bits using a unique pixel of a display;

generating a second graphic image representative of said second device test file by depicting each of said second plurality of bits using a unique pixel of a display; and overlaying said second graphic image onto said first graphic image.

2. The method as recited in claim 1, wherein a visual attribute associated with each pixel is dependent upon a value associated with each of said first and said second plurality of bits.

3. The method as recited in claim 1, wherein each said first device test file and said second device test file is a device test result file.

4. The method as recited in claim 2, wherein said visual attribute associated with each pixel is color.

5. The method as recited in claim 2, wherein said visual attribute associated with each pixel is brightness.

6. The method as recited in claim 2, wherein said value associated with each of said first and said second plurality of bits is an ASCII character representative of a binary value.

7. The method as recited in claim 2, wherein said value associated with each of said plurality of bits is an ASCII character representative of a don't care value.

8. The method as recited in claim 1, wherein each of said plurality of bits represents a state of a storage element within said device.

9. The method as recited in claim 8, wherein a position of a given pixel within said first graphic image and said second graphic image corresponds to a position of an associated one of said plurality of bits within said first device test file and said second device test file, respectively.

10. A method of displaying test data for a device, said method comprising:

receiving a first graphic image representative of a first device test file comprising a first scan test pattern including a first plurality of bits, wherein said first device test file depicts each of a first plurality of bits using a unique pixel of a display;

receiving a second graphic image representative of a second device test file comprising a second scan test pattern including a second plurality of bits, wherein said second device test file depicts each of a second plurality of bits using a unique pixel of a display; and generating a third graphic image by overlaying said second graphic image onto said first graphic image.

11. The method as recited in claim 10, wherein a visual attribute associated with each pixel is dependent upon a value associated with each of said first and said second plurality of bits.

12. The method as recited in claim 10, wherein a visual attribute associated with each resultant pixel is dependent upon a comparison of said visual attributes associated with each pixel of said first and said second graphic image.

13. The method as recited in claim 11, wherein each of said first and said second device test files is a device test result file.

14. The method as recited in claim 11, wherein a visual attribute associated with each pixel is color.

15. The method as recited in claim 11, wherein a visual attribute associated with each pixel is brightness.

16. The method as recited in claim 10, wherein each of said plurality of bits represents a state of a storage element within said device.

17. The method as recited in claim 10, wherein a position of a given pixel within said graphic image corresponds to a position of an associated one of said plurality of bits within said test file.

18. A carrier medium comprising program instructions, wherein the program instructions are computer-executable to:

receive a first test file comprising a first scan test pattern, wherein said test file includes a first plurality of bits;

receive a second test file comprising a second scan test pattern, wherein said test file includes a second plurality of bits;

generate a first graphic image representative of said first test file by depicting each of said first plurality of bits using a unique pixel of a display;

generate a second graphic image representative of said test file by depicting each of said plurality of bits using a unique pixel of a display; and overlay said second graphic image onto said first graphic image.

19. A carrier medium comprising program instructions, wherein the program instructions are computer-executable to:

receive a first graphic image representative of a first device test file comprising a first scan test pattern including a first plurality of bits, wherein said first device test file depicts each of a first plurality of bits using a unique pixel of a display;

receive a second graphic image representative of a second device test file comprising a second scan test pattern including a second plurality of bits, wherein said second device test file depicts each of a second plurality of bits using a unique pixel of a display; and generate a third graphic image by overlaying said second graphic image onto said first graphic image.

* * * * *